(12) United States Patent
Huang et al.

(10) Patent No.: US 7,625,767 B2
(45) Date of Patent: Dec. 1, 2009

(54) METHODS OF MAKING SPINTRONIC DEVICES WITH CONSTRAINED SPINTRONIC DOPANT

(75) Inventors: Xiangyang Huang, Waltham, MA (US); Samed Halilov, Waltham, MA (US); Jean Augustin Chan Sow Fook Yiptong, Worchester, MA (US); Ilija Dukovski, Newtonville, MA (US); Marek Hytha, Brookline, MA (US); Robert J. Mears, Wellesley, MA (US)

(73) Assignee: Mears Technologies, Inc., Waltham, MA (US)

( * ) Notice: Subject to any disclaimer, the term of this patent is extended or adjusted under 35 U.S.C. 154(b) by 325 days.

(21) Appl. No.: 11/687,430

(22) Filed: Mar. 16, 2007

(65) Prior Publication Data
US 2007/0238274 A1    Oct. 11, 2007

Related U.S. Application Data (60) Provisional application No. 60/783,598, filed on Mar. 17, 2006.

(51) Int. Cl.
*H01L 21/00* (2006.01)
(52) U.S. Cl. .................. 438/3; 438/48; 438/22; 438/52; 257/295
(58) Field of Classification Search ............. 438/3, 438/22–24, 48–52
See application file for complete search history.

(56) References Cited

U.S. PATENT DOCUMENTS

| | | | |
|---|---|---|---|
| 4,665,412 A * | 5/1987 | Ohkawa et al. ............ 257/17 |
| 5,294,287 A | 3/1994 | Chang et al. ............ 156/611 |
| 6,807,091 B2 | 10/2004 | Saito ...................... 365/173 |
| 6,885,065 B2 | 4/2005 | Liang et al. ............. 257/347 |
| 6,891,188 B2 | 5/2005 | Mears et al. .............. 257/15 |
| 7,153,763 B2 | 12/2006 | Hytha et al. ............ 438/604 |
| 2004/0178460 A1* | 9/2004 | Lee et al. ................ 257/421 |
| 2005/0258416 A1 | 11/2005 | Fong et al. ............... 257/14 |
| 2006/0018816 A1* | 1/2006 | Nause et al. ............ 423/324 |
| 2006/0060815 A1 | 3/2006 | Punnoose ............... 252/62 |
| 2007/0007568 A1 | 1/2007 | Tanaka et al. ........... 257/295 |

OTHER PUBLICATIONS

Sanvito et al., "Ab Initio Transport Theory for Digital Ferromagnetic Heterostructures", vol. 87, No. 26 © 2001 The American Physical Society; dated Dec. 24, 2001.
Jonker et al., "Electrical Spin Injection and Transport in Semiconductor Spintronic Devices", MRS Bulletin/Oct. 2003, pp. 740-746.

* cited by examiner

*Primary Examiner*—Dung A. Le
(74) *Attorney, Agent, or Firm*—Allen, Dyer, Doppelt, Milbrath & Gilchrist, P.A., Attorneys at Law (57) ABSTRACT

A method is for making a spintronic device and may include forming at least one superlattice and at least one electrical contact coupled thereto, with the at least one superlattice including a plurality of groups of layers. Each group of layers may include a plurality of stacked base semiconductor monolayers defining a base semiconductor portion having a crystal lattice, at least one non-semiconductor monolayer constrained within the crystal lattice of adjacent base semiconductor portions, and a spintronic dopant. The spintronic dopant may be constrained within the crystal lattice of the base semiconductor portion by the at least one non-semiconductor monolayer. In some embodiments, the repeating structure of a superlattice may not be needed.

24 Claims, 7 Drawing Sheets

STABILITY

METHODS OF MAKING SPINTRONIC DEVICES WITH CONSTRAINED SPINTRONIC DOPANT

RELATED APPLICATION

This application is based upon prior filed copending provisional application Ser. No. 60/783,598 filed Mar. 17, 2006, the entire subject matter of which is incorporated herein by reference in its entirety.

FIELD OF THE INVENTION

The present invention relates to the field of electronics, and, more particularly, to the field of spin-based electronics and associated methods.

BACKGROUND OF THE INVENTION

Figure 1A:
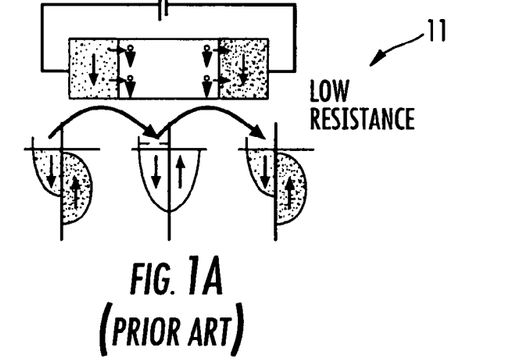
FIG. 1A is a schematic diagram of a spin valve as is in the prior art illustrated in a low resistance state.
Figure 1B:
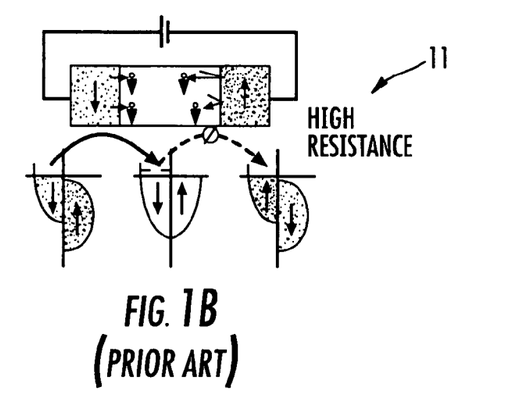
FIG. 1B is a schematic diagram of the prior art spin valve as shown in FIG. 1A illustrated in a high resistance state.
Figure 2:
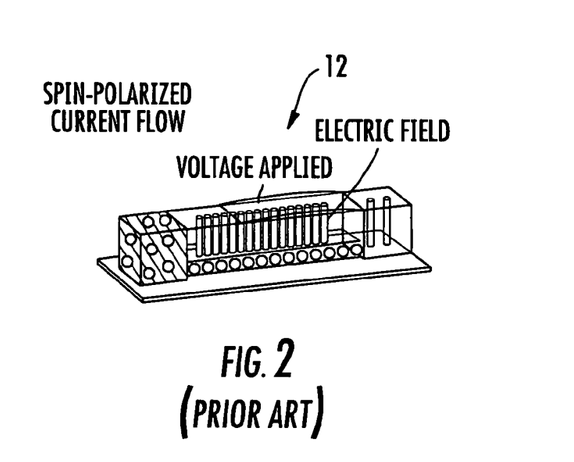
FIG. 2 is a schematic perspective view of a spin FET as in the prior art.
Figure 3:
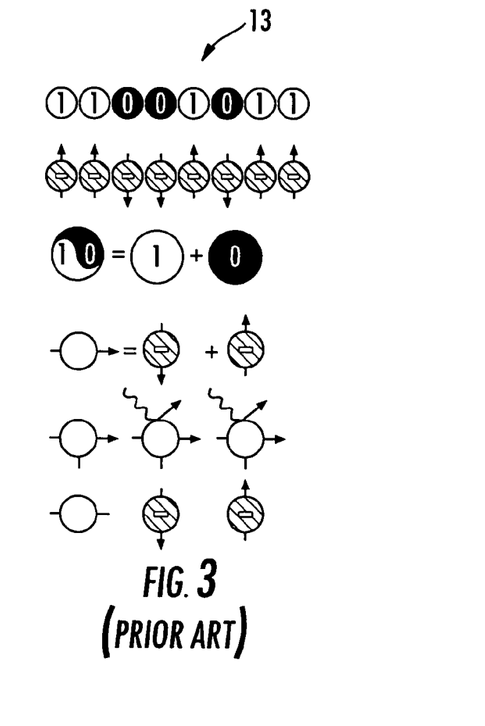
FIG. 3 is a schematic diagram of a quantum bit device as in the prior art.

Spin-based electronics or spintronics exploit both the charge of electrons as well as the spin of the electrons to permit new devices with enhanced functions, higher speeds, and/or reduced power consumption, for example. An exemplary spintronic device is the spin valve as illustrated in the FIGS. 1A and 1B. The spin valve 11 provides a low resistance when the spins are aligned (FIG. 1A), and provides a high resistance with the spins not aligned (FIG. 1B). The spin valve 11 may be used as a nonvolatile memory element, for example. Other exemplary spintronic devices including the spin-FET 12 schematically illustrated in FIG. 2, and the quantum bit device 13 illustrated in FIG. 3.

Figure 4A:
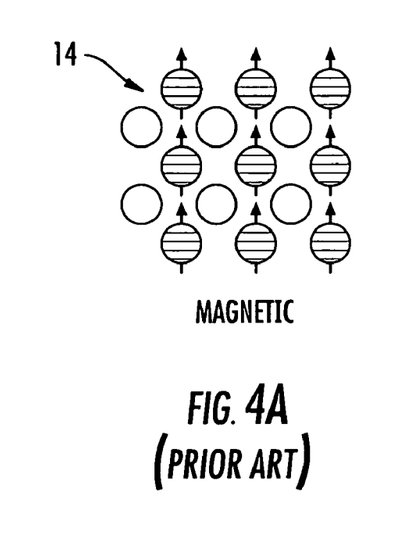
FIG. 4A is a schematic diagram of a magnetic material as in the prior art.
Figure 4B:
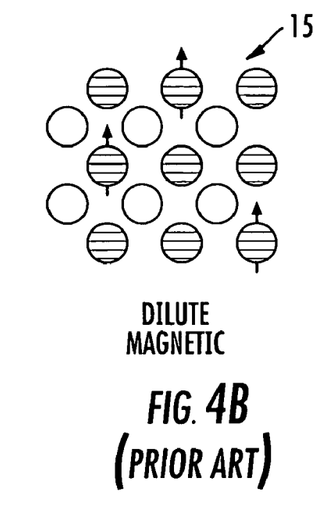
FIG. 4B is a schematic diagram of a dilute magnetic material as in the prior art.
Figure 4C:
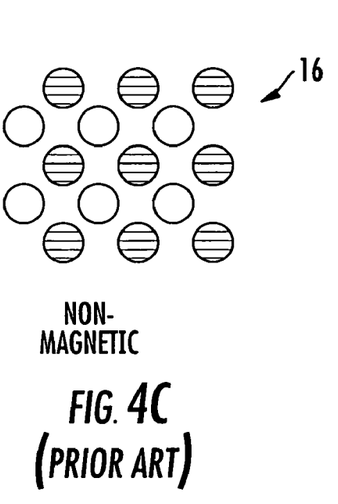
FIG. 4C is a schematic diagram of a non-magnetic material as in the prior art.

Published U.S. Patent Application No. 2006/0018816, for example, discloses a Diluted Magnetic Semiconductor (DMS) comprising zinc oxide which includes a transition element or a rare earth lanthanide, or both, in an amount sufficient to change the material from non-magnetic state to a room temperature ferromagnetic state. The material may be in a bulk form or a thin film form. A DMS material is a semiconductor in which transition metal ions or rare earth lanthanides substitute cations of host semiconductor materials. More particularly, a DMS material 15 is schematically illustrated in FIG. 4B, while to the left in FIG. 4A is a magnetic material 14, and to the right in FIG. 4C is a non-magnetic material 16.

Published U.S. Patent Application No. 2005/0258416 discloses a spintronic switching device comprising a half-metal region between first and second conductive regions. The half-metal region comprises a material that, at the intrinsic Fermi level, has substantially zero available electronic states in a minority spin channel. Changing the voltage of the half-metal region with respect to the first conducting region moves its Fermi level with respect to the electron energy bands of the first conducting region, which changes the number of available electronic states in the majority spin channel. In doing so, this changes the majority spin polarized current passing through the switching device. The half-metal region may comprise CrAs and the conducting regions may comprise a p-doped or n-doped semiconductor. For example, the p-doped semiconductor may comprise Mn doped GaAs.

Published U.S. Patent Application No. 2004/0178460 discloses a spintronic device application as a memory and a logic device using a spin valve effect obtained by injecting a carrier spin-polarized from a ferromagnetic into a semiconductor at room temperature, and a spin-polarized field effect transistor. The ferromagnet is disclosed as one of a Fe, Co, Ni, FeCo, NiFe, GaMnAs, InMnAs, GeMn, and GaMnN, and can be a half metal having a spin polarization of 100% such as $CrO_2$.

The semiconductor may be one selected from Si, GaAs, InAs, and Ge. Also, the spin channel region is disclosed as Si on insulator (SOI) or a two-dimensional electron gas of a compound semiconductor.

An article to Jonker et al. "Electrical Spin Injection and Transport in Semiconductor Spintronic Devices", MRS Bulletin/October 2003, pp. 740-748, discloses semiconductor heterostructures that use carrier spin as a new degree of freedom. The article discloses four essential requirements for implementing a semiconductor spintronics technology in devices, and provides that the efficient electrical injection of spin-polarized carriers into the semiconductor has been a critical issue severely hampering progress in this field. The article further discloses that advances in materials quality have increased the Curie temperature of $Ga_{1-x}Mn_xAs$ to ~150° K with the potential of exceeding room temperature. Spin-dependent resonant tunneling is identified as able to increase the spin selectivity of tunneling contacts in a very efficient way. A double-barrier heterojunction (DBH) comprising a nonmagnetic semiconductor quantum well between two insulating barriers and two ferromagnetic semiconductive electrodes may behave as half-metallic junctions if the parameters of the quantum well and barrier are properly tuned.

Current spintronics technology is limited by the currently used materials. For example, it is important, as noted by Jonker et al., to have efficient spin carrier injection. It is also desirable to have manufacturing and operational compatibility with existing semiconductor processing technology. It is also desirable that the magnetic ordering or Curie temperature by at or near room temperature, instead of the more typical 100-200° K. One potential approach is the DMS materials as disclosed in the above noted U.S. Patent Application No. 2004/0178460.

Figure 5:
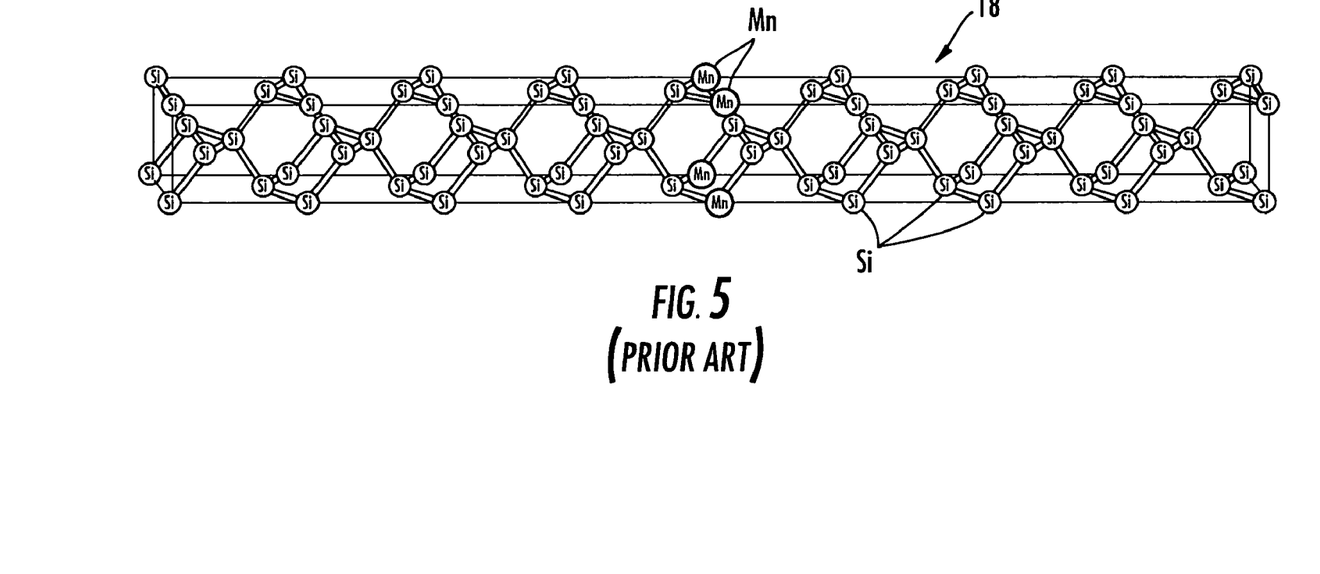
FIG. 5 is a schematic atomic diagram for a Digital Ferromagnetic Heterostructure (DFH) as in the prior art.

Another spintronic device structure is the Digital Ferromagnetic Heterostructure (DFH) as disclosed, for example, by Sanvito et al. in an article "Ab Initio Transport Theory for Digital Ferromagnetic Heterostructures" in Physical Review Letters, Vol. 87, No. 26, Dec. 24, 2001, pp. 1-4. The article notes that the solubility limit of Mn in GaAs is rather small; however, a large MN concentration can be obtained in a zinc blende MnAs submonolayers into GaAs to form a MnAs/GaAs superlattice. A schematic diagram of a prior art DFH structure 18 is shown in FIG. 5 with a transition metal (Tm) in the form of Mn within a Silicon superlattice. Although this may have a large spin polarization at the Fermi level and a large magnetoresistance effect and Curie temperature higher than in the bulk, it may suffer from a low thermal stability.

Unfortunately, many of the materials and structures for spintronic devices have relatively low concentrations of the spintronic dopant, such as Mn. The spintronic dopant tends to precipitate out of the crystal lattice, especially as the concentration is increased, and/or the device is subjected to thermal processing steps.

SUMMARY OF THE INVENTION

This and other objects, features and advantages in accordance with the present invention are provided by method for making a spintronic device comprising forming at least one superlattice and forming at least one electrical contact coupled thereto, with the at least one superlattice comprising a plurality of groups of layers. Each group of layers may comprise a plurality of stacked base semiconductor monolayers defining a base semiconductor portion having a crystal lattice, at least one non-semiconductor monolayer constrained within the crystal lattice of adjacent base semiconductor portions, and a spintronic dopant. Moreover, the spintronic dopant may be constrained within the crystal lattice of the base semiconductor portion by the at least one non-semiconductor monolayer. Accordingly, a fairly high spintronic dopant concentration may be achieved and maintained while reducing a likelihood of precipitation of the spintronic dopant.

The spintronic dopant may comprise at least one spintronic dopant monolayer adjacent the at least one non-semiconductor monolayer. This may be so, for example, where the energy levels favor attraction and retention of the spintronic dopant to the non-semiconductor. The spintronic dopant may comprises a transition metal, such as at least one of Manganese, Iron, and Chromium. Alternatively or additionally the spintronic dopant may comprise a rare earth, such as a rare earth lanthanide, for example.

The non-semiconductor may comprise at least one of Oxygen, Nitrogen, Fluorine, Carbon-Oxygen, and Sulphur, for example. The semiconductor may comprise Silicon, or more generally, may comprise a semiconductor selected from the group comprising Group IV semiconductors, Group III-V semiconductors, and Group II-VI semiconductors. The specific materials and structural configurations may be preferably selected so that the superlattice exhibits a Curie temperature of at least as high as room temperature.

An embodiment of the spintronic device may be for making a spintronic field effect transistor. Accordingly, the method may include forming a pair of superlattices in spaced apart relation on a substrate to define a source and a drain, forming a channel between the source and drain, and forming a gate adjacent the channel. Another embodiment may be for making a spin valve. The method may also include forming a pair of superlattices in spaced apart relation on a substrate with a spacer between the pair of superlattices.

In some embodiments the repeating structure of a superlattice may not be needed. In other words, the method may comprise forming a plurality of stacked base semiconductor monolayers defining a base semiconductor portion having a crystal lattice, at least one non-semiconductor monolayer constrained within the crystal lattice, and providing a spintronic dopant constrained within the crystal lattice of the base semiconductor portion by the at least one non-semiconductor monolayer. In addition, the method may also include forming an electrical contact coupled to the base semiconductor portion.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer, to like elements throughout.

Figure 6A:
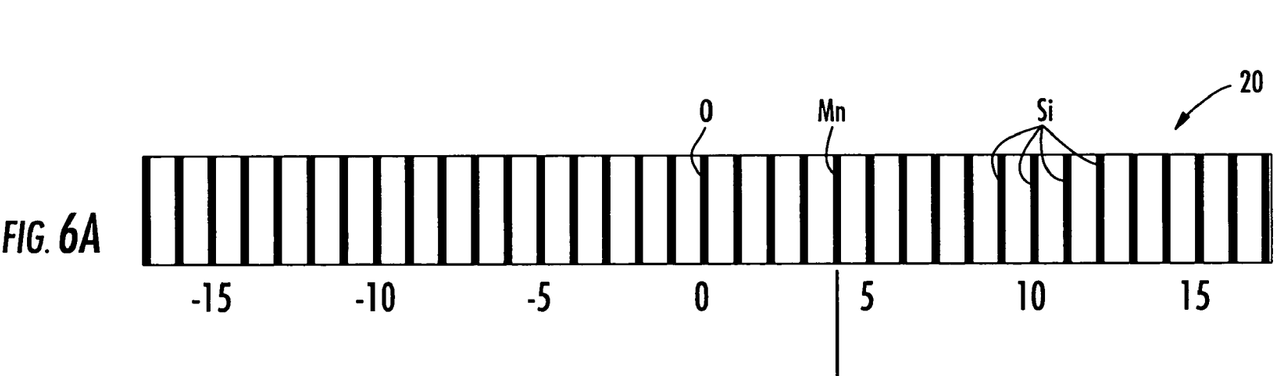
FIGS. 6A and 6B are, respectively, a schematic diagram and energy level diagram for a DFH in accordance with the invention.
Figure 6B:
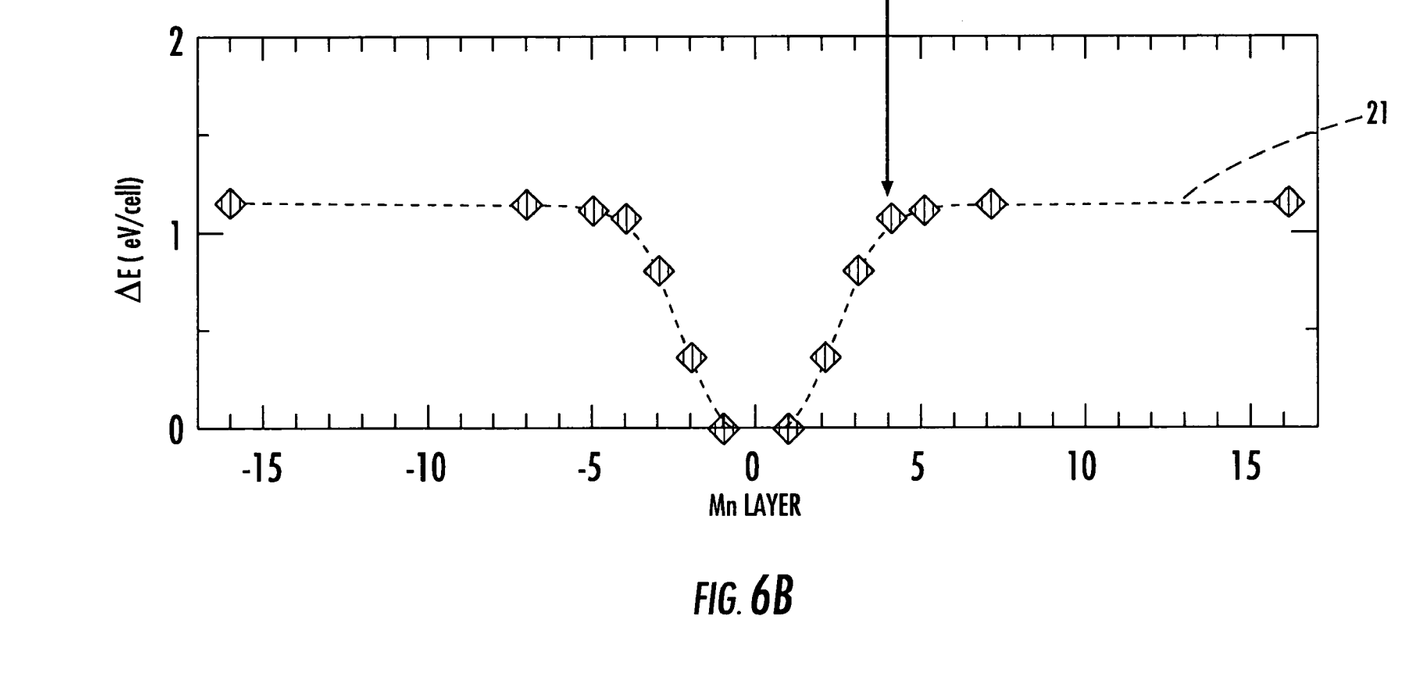

Referring now to FIGS. 6A and 6B, a first example of the present invention is now described. In the schematically illustrated DFH structure 20 of FIG. 6A, Oxygen is included in the Si superlattice also including a transition metal, such as Mn. As can be seen in the energy level diagram 21 of FIG. 6B, the Mn will have lower energy as it approaches the Oxygen layer. In other words, when the Mn atoms stick to the Silicon atoms, the structure is most energetically favorable, and the Mn atoms can be well positioned and confined in the Silicon. As will be appreciated by those skilled in the art, the relative positioning of the Mn atoms with respect to the Oxygen atoms may be used to tune the Curie temperature (Tc), for example. The Tc may be much higher than room temperature for a 2D confined system, for example. The DFH structure 20 with Oxygen is advantageously more thermally stable than prior art structures.

Mn, for example, substitutionally introduces only a small stress into the Silicon monocrystalline structure. Mn is an example of a transition metal suitable for spintronic devices. Those of skill in the art will appreciate that other materials may be used as well, such as, for example, Fe, Cr, etc. Rare earth elements may also be used, such as rare earth lanthanides.

Other materials may also be used in place of or in combination with Oxygen. For example, Nitrogen, Fluorine, Carbon-Oxygen, and Sulphur are suitable materials. In addition, the base semiconductor illustratively in the form of Si, may be a semiconductor selected from the group comprising Group IV semiconductors, Group III-V semiconductors, and Group II-VI semiconductors. Of course, and the term Group IV semiconductors also includes Group IV-IV semiconductors.

Figure 7:
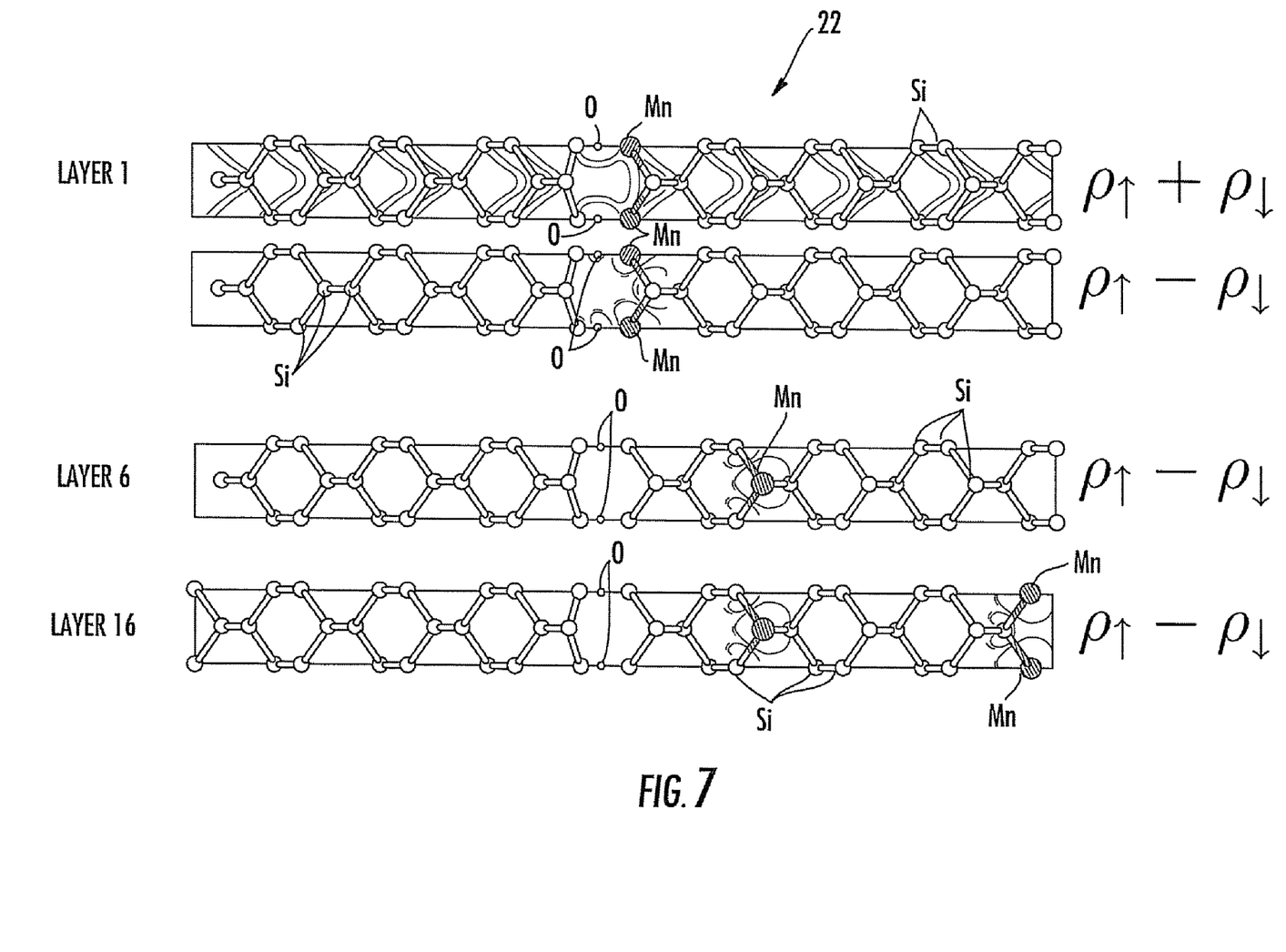
FIG. 7 is a schematic atomic diagram for a DFH structure in accordance with the invention.

The charge and spin densities of various layers of a DFH structure 22 and incorporating Oxygen along with Mn in an Si monocrystalline superlattice is schematically illustrated in FIG. 7. Layer 1 is shown to be in a conductive state, in contrast to the other layers, Layers 6 and 16.

Figures 8, 9, 10A, 10B, 10C:
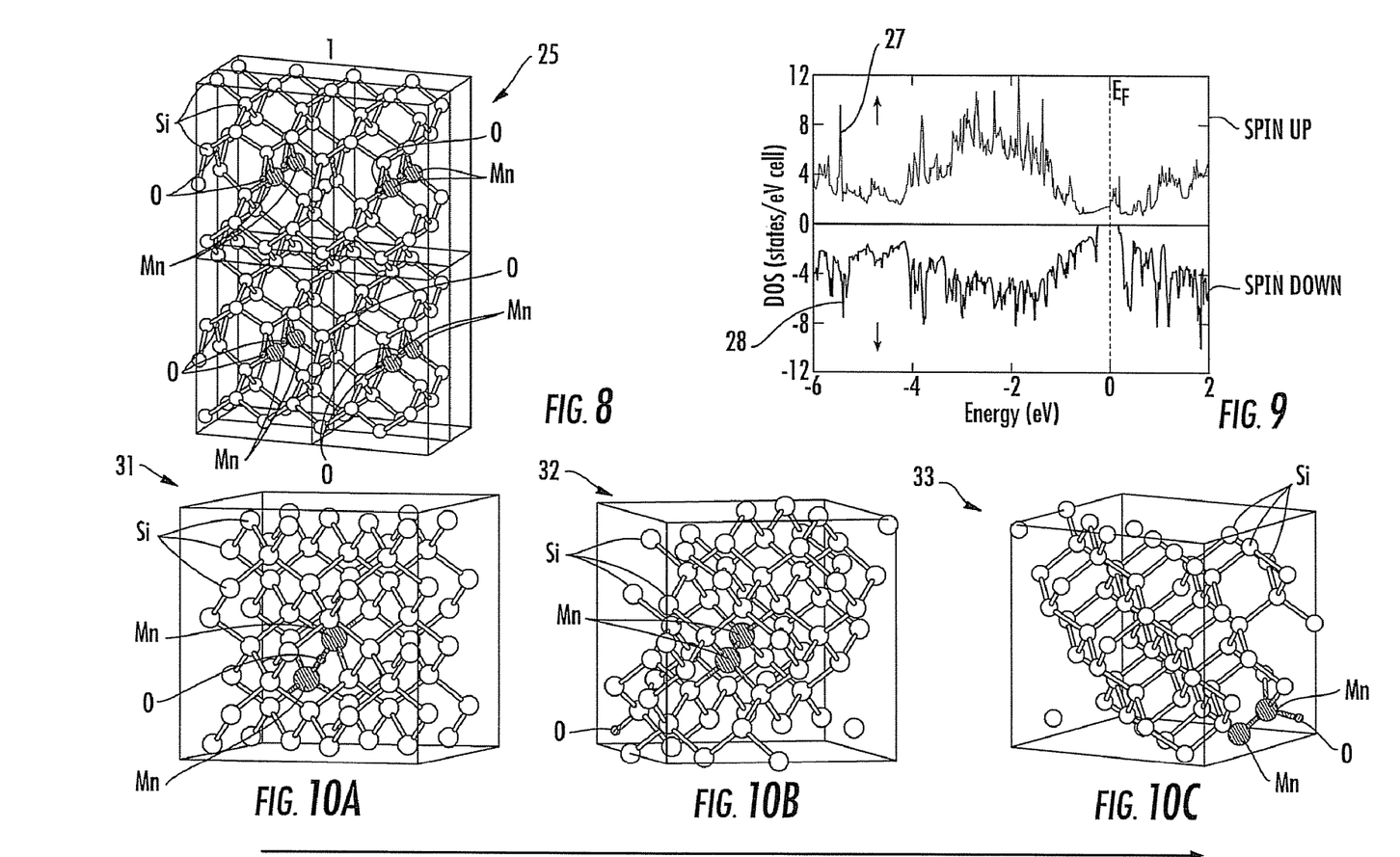
FIG. 8 is a schematic atomic model of a portion of a superlattice for a spintronic device in accordance with the present invention.
FIG. 9 is a combined energy diagram for the superlattice as shown in FIG. 8.
FIGS. 10A-10C are schematic atomic diagrams of various relative atomic positions of Si, O, and Mn in a spintronic device in accordance with the invention.

A schematic atomic model 25 is shown in FIG. 8, with the transition metal (e.g. Mn) incorporated in the Silicon lattice along with Oxygen. With reference to FIG. 9, the spin-up energy states 27 (top) and the spin-down energy states 28 (bottom) are shown. The spin-up energy diagram 27 indicates that current will flow because of the low energy states at the Fermi level as will be appreciated by those skilled in the art, and in contrast to the high energy states at the Fermi level for the spin-down diagram 28.

Referring now additionally to FIGS. 10A-10C the relative energetics of various Si—Mn—O structures are schematically illustrated. More particularly, the structure 31 shown in FIG. 10A with an Oxygen atom between adjacent Mn atoms offers the lowest stability, the structure 32 shown in FIG. 10B with an Oxygen atom remote from a pair of Mn atoms offers an intermediate stability, and the structure 33 shown in FIG. 10C with an Oxygen atom tied to one of a pair of Mn atoms offers the highest relative stability.

In some embodiments, the spintronic device may comprise at least one superlattice and at least one electrical contact coupled thereto, with the at least one superlattice comprising a plurality of groups of layers. Each group of layers may comprise a plurality of stacked base semiconductor monolayers defining a base semiconductor portion having a crystal lattice, at least one non-semiconductor monolayer constrained within the crystal lattice of adjacent base semiconductor portions, and a spintronic dopant. The base semiconductor portion may comprise 5 to 30 monolayers, for example. The spintronic dopant may be constrained within the crystal lattice of the base semiconductor portion by the at least one non-semiconductor monolayer as described above. Accordingly, a relatively high spintronic dopant concentration may be achieved and maintained while reducing a likelihood of precipitation of the spintronic dopant. For example, the concentration of the spintronic dopant may be in the range of from about 0.1 to 10 percent.

The spintronic dopant may comprise at least one spintronic dopant monolayer adjacent the at least one non-semiconductor monolayer. This may be so, for example, where the energy levels favor attraction and retention of the spintronic dopant to the non-semiconductor.

Further details regarding superlattice structures including Silicon and Oxygen to achieve energy band modifications, such as to increase charge carrier mobility, are described in commonly assigned U.S. Pat. Nos. 6,891,188 and 7,153,763, for example, the entire contents of which are incorporated herein by reference. In accordance with the spintronic devices described herein, Applicants theorize without wishing to be bound thereto that the non-semiconductor monolayer(s) may serve to collect or at least contain the spintronic dopant to keep the dopant from precipitating out, especially during any subsequent thermal processing steps as will be appreciated by those skilled in the art. In some embodiments, the spintronic dopant may be added by atomic layer deposition. In other embodiments, the spintronic dopant may be added by implantation and optionally followed by an anneal, for example, while the non-semiconductor monolayer(s) serves to at least contain the dopant.

The non-semiconductor monolayer may be initially formed in a non-continuous fashion, that is, without all available positions for Oxygen being filled in the Silicon lattice, for example. Moreover, Applicants also theorize without wishing to be bound thereto that Atomic Layer Deposition (ALD) of the monolayers may tend to form clusters on an atomic level rather than clearly or precisely defined monolayers, especially when subjected to subsequent thermal processes. For example, the superlattices in some cases may be formed before shallow trench isolation (STI) formation, and are thus subjected to thermal processing during STI formation.

Accordingly, the term monolayer is intended to cover this theorized clustering phenomenon, and is not limited to a precise mathematical or atomic stick model layer as will be appreciated by those skilled in the art. It is also theorized by Applicants without their wishing to be bound thereto, that a clustering phenomenon may be considered to occur with the spintronic dopant, especially for the those combinations of materials, such as Si—O—Mn, where the Mn will be attracted to the O.

Extending the principles described herein further, in some embodiments the repeating structure of a superlattice may not be needed. In other words, the spintronic device may comprise a plurality of stacked base semiconductor monolayers defining a base semiconductor portion having a crystal lattice, at least one non-semiconductor monolayer constrained within the crystal lattice, and a spintronic dopant constrained within the crystal lattice of the base semiconductor portion by the at least one non-semiconductor monolayer. The device may also include an electrical contact coupled to the base semiconductor portion.

Figure 11:
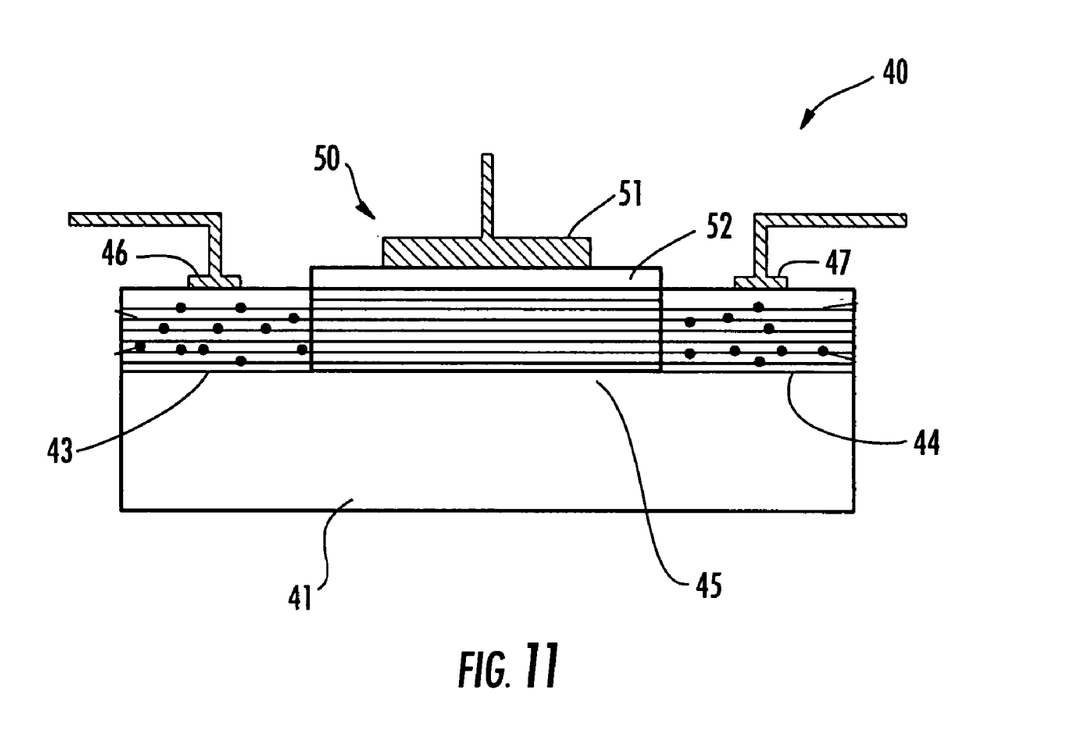
FIG. 11 is a schematic cross-sectional diagram of a spintronic FET in accordance with the invention.

Referring now additionally to FIG. 11, an example of a spintronic device in the form of a spintronic field effect transistor (FET) 40 is now described. The spintronic FET 40 illustratively includes a semiconductor substrate 41 carrying a pair of superlattices in spaced apart relation to define a source 43 and a drain 44, with a channel 45 between the source and drain, and a gate 50 adjacent the channel. The gate 50 includes a dielectric layer 52 and a gate electrode or contact 51 thereon.

For clarity of explanation the source 43 and drain 44 are illustrated with a plurality of horizontally extending lines schematically indicating the repeating groups of the superlattice and with dots indicative of the spintronic dopant. A source contact 46 and a drain contact 47 are illustratively coupled to the source 43 and drain 44 respectively. The channel 45 is illustratively in the form of a superlattice as well, but without the spintronic dopant. In other embodiments, the channel need not be a superlattice as will be appreciated by those skilled in the art. In yet other embodiments, only one of the source or drain may be a superlattice.

Figure 12:
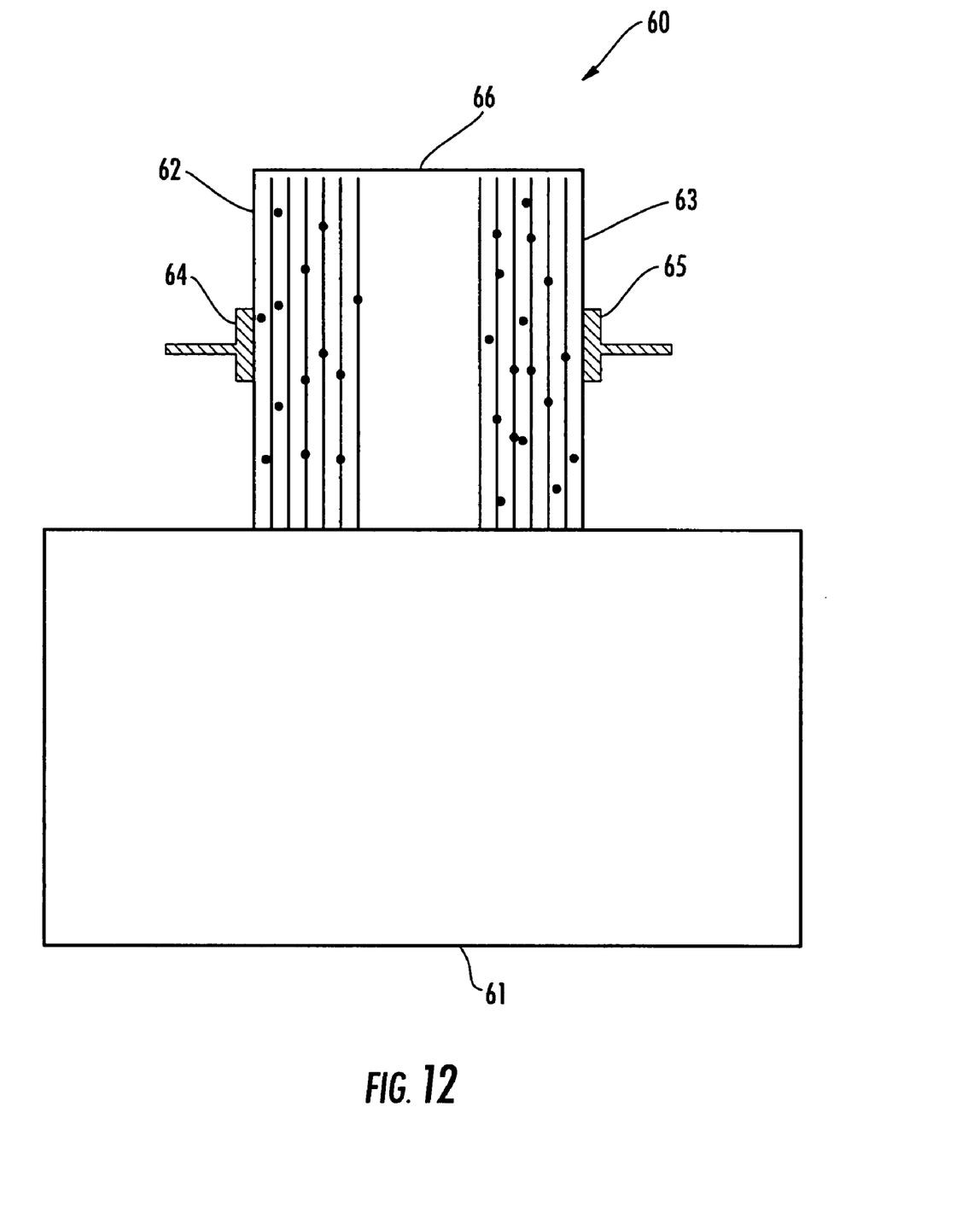
FIG. 12 is a schematic cross-sectional diagram of a spin valve in accordance with the invention.

Another embodiment of a spintronic device is the spin valve 60 explained with additional reference to FIG. 12. The spin valve 60 also includes a semiconductor substrate 61 that carries on its upper surface a pair of superlatices 62, 63 in spaced apart relation with a spacer 66 between the pair of superlattices. Respective electrical contacts 64, 65 are coupled to the superlattices 64, 65. As will be appreciated by those skilled in the art, one of the superlattices 64, 65 may be constructed to be pinned or be a hard ferromagnetic region, while the other is a soft ferromagnetic region.

A method aspect is for making a spintronic device comprising forming at least one superlattice and forming at least one electrical contact coupled thereto, with the at least one superlattice comprising a plurality of groups of layers. Each group of layers may comprise a plurality of stacked base semiconductor monolayers defining a base semiconductor portion having a crystal lattice, at least one non-semiconductor monolayer constrained within the crystal lattice of adjacent base semiconductor portions, and a spintronic dopant. Moreover, the spintronic dopant may be constrained within the crystal lattice of the base semiconductor portion by the at least one non-semiconductor monolayer. Other method aspects will also be understood by those skilled in the art based on the teachings herein.

The spintronic devices described herein, including the spintronic FET and spin valve, may also be configured without the repeating structure of the superlattice as will be appreciated by those of skill in the art. The materials described herein may be used in many spintronic devices, particularly for increasing the injection efficiency of spin carriers believed due to the material compatibility at the interface. The thermal stability of the devices may also be greatly enhanced believed due to the Oxygen being held in the crystal lattice, and the Mn being thermally stable adjacent the Oxygen atoms. Other general references in the field of spintronics include an article by Park et al. appearing in Science 295, 651 (2002); an article to Qian et al. in Phys. Rev. Lett. 96, 027211 (2006); and an article to Ohno et al. appearing in Nature 402, 790 (1999).

Other features and advantages are disclosed in commonly assigned, co-pending application Ser. No. 11/687,422 entitled SPINTRONIC DEVICES WITH CONSTRAINED SPINTRONIC DOPANT, the entire disclosure of which is incorporated herein in its entirety by reference.

In addition, many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the invention.

The invention claimed is:

1. A method for making a spintronic device comprising:
   forming at least one superlattice; and
   forming at least one electrical contact coupled to the at least one superlattice;
   the at least one superlattice comprising a plurality of groups of layers with each group of layers comprising
   a plurality of stacked base semiconductor monolayers defining a base semiconductor portion having a crystal lattice,
   at least one non-semiconductor monolayer constrained within the crystal lattice of adjacent base semiconductor portions, and
   at least one spintronic dopant monolayer adjacent the at least one non-semiconductor monolayer and constrained within the crystal lattice of the base semiconductor portion by the at least one non-semiconductor monolayer.

2. The method according to claim 1 wherein said at least one spintronic dopant monolayer comprises a transition metal dopant.

3. The method according to claim 1 wherein said at least one spintronic dopant monolayer comprises a Manganese dopant.

4. The method according to claim 2 wherein the transition metal dopant comprises at least one of Manganese, Iron, and Chromium.

5. The method according to claim 1 wherein said at least one spintronic dopant monolayer comprises a rare earth element dopant.

6. The method according to claim 5 wherein the rare earth element dopant comprises a rare earth lanthanide.

7. The method according to claim 1 wherein the at least one non-semiconductor monolayer comprises Oxygen.

8. The method according to claim 1 wherein the at least one-non-semiconductor monolayer comprises at least one of Oxygen, Nitrogen, Fluorine, Carbon-Oxygen, and Sulphur.

9. The methods according to claim 1 wherein the semiconductor comprises Silicon.

10. The method according to claim 1 wherein the semiconductor comprises a semiconductor selected from the group comprising Group IV semiconductors, Group III-V semiconductors, and Group II-VI semiconductors.

11. The method according to claim 1 wherein forming the at least one superlattice comprises forming a pair of superlattices; and further comprising:
    providing a substrate carrying the pair of superlattices in spaced apart relation to define a source and a drain;
    forming a channel between the source and drain; and
    forming a gate adjacent the channel so that the spintronic device defines a spintronic field effect transistor.

12. The method according to claim 1 wherein forming the at least one superlattice comprises forming a pair of superlattices; and further comprising:
    providing a substrate carrying the pair of superlattices in spaced apart relation; and
    forming a spacer between the pair of superlattices so that the spintronic device defines a spintronic valve.

13. The method according to claim 1 wherein the at least one superlattice exhibits a Curie temperature of at least as high as room temperature.

14. A method for making a spintronic device comprising:
    forming at least one superlattice; and
    forming at least one electrical contact coupled to the at least one superlattice;
    the at least one superlattice comprising a plurality of groups of layers with each group of layers comprising
    a plurality of stacked base Silicon monolayers defining a base Silicon portion having a crystal lattice,
    at least one Oxygen monolayer constrained within the crystal lattice of adjacent base Silicon portions, and
    at least one spintronic dopant monolayer adjacent the at least one non-semiconductor monolayer and constrained within the crystal lattice of the base Silicon portion by the at least one Oxygen monolayer.

15. The method according to claim 14 wherein the at least one spintronic dopant monolayer comprises at least one of a transition metal, and a rare earth element dopant.

16. The method according to claim 14 wherein forming the at least one superlattice comprises forming a pair of superlattices; and further comprising:
    providing a substrate carrying the pair of superlattices in spaced apart relation to define a source and a drain;
    forming a channel between the source and drain; and
    forming a gate adjacent the channel so that the spintronic device defines a spintronic field effect transistor.

17. The method according to claim 14 wherein forming the at least one superlattice comprises forming a pair of superlattices; and further comprising:
    providing a substrate carrying the pair of superlattices in spaced apart relation; and
    forming a spacer between the pair of superlattices so that the spintronic device defines a spintronic valve.

18. The method according to claim 14 wherein the at least one superlattice exhibits a Curie temperature of at least as high as room temperature.

19. A method for making spintronic device comprising:
    forming a plurality of stacked base semiconductor monolayers defining a base semiconductor portion having a crystal lattice;
    forming at least one non-semiconductor monolayer constrained within the crystal lattice;
    providing at least one spintronic dopant monolayer adjacent the at least one non-semiconductor monolayer and constrained within the crystal lattice of the base semiconductor portion by the at least one non-semiconductor monolayer; and
    forming an electrical contact coupled to the base semiconductor portion.

20. The method according to claim 19 wherein the at least one spintronic dopant monolayer comprises at least one of a transition metal and a rare earth element dopant.

21. The method according to claim 19 wherein the at least one non-semiconductor monlayer comprises at least one of Oxygen, Nitrogen, Fluorine, Carbon-Oxygen, and Sulphur.

22. The method according to claim 19 wherein the semiconductor comprises a semiconductor selected from the group comprising Group IV semiconductors, Group III-V semiconductors, and Group II-VI semiconductors.

23. The method according to claim 19 further comprising providing a substrate carrying the base semiconductor portion.

24. The method according to claim 19 wherein the base semiconductor portion exhibits a Curie temperature of at least as high as room temperature.

* * * * *